US012771169B2

(12) United States Patent

Thanachayanont

(10) Patent No.: US 12,771,169 B2
(45) Date of Patent: Oct. 20, 2026

(54) POWER EXTRACTION CIRCUIT FOR RADIO FREQUENCY IDENTIFICATION (RFID) TAGS AND POWER EXTRACTION METHOD THEREOF

(71) Applicant: SILICON CRAFT TECHNOLOGY PUBLIC COMPANY LIMITED (SICT), Bangkok (TH)

(72) Inventor: Apinunt Thanachayanont, Bangkok (TH)

(73) Assignee: SILICON CRAFT TECHNOLOGY PUBLIC COMPANY LIMITED (SICT), Bangkok (TH)

( * ) Notice: Subject to any disclaimer, the term of this patent is extended or adjusted under 35 U.S.C. 154(b) by 102 days.

(21) Appl. No.: 18/856,947

(22) PCT Filed: Aug. 7, 2023

(86) PCT No.: PCT/IB2023/057951

§ 371 (c)(1),
(2) Date: Oct. 15, 2024

(87) PCT Pub. No.: WO2025/032357

PCT Pub. Date: Feb. 13, 2025

(65) Prior Publication Data

US 2026/0189067 A1 Jul. 2, 2026

(51) Int. Cl.

*H02J 50/00* (2016.01)
*G06K 19/07* (2006.01)
*H02J 50/20* (2016.01)
*H03H 7/38* (2006.01)

(52) U.S. Cl.

CPC ........ *H02J 50/001* (2020.01); *G06K 19/0726* (2013.01); *H02J 50/005* (2020.01); *H02J 50/20* (2016.02); *H03H 7/38* (2013.01)

(58) Field of Classification Search

CPC ........ H02J 50/001; H02J 50/20; H02J 50/005; G06K 19/0726; H03H 7/38
USPC .......................................................... 307/149
See application file for complete search history.

(56) References Cited

U.S. PATENT DOCUMENTS 9,646,186 B1 * 5/2017 Hyde ............... G06K 19/07773
2006/0094425 A1 * 5/2006 Mickle ............... G06K 19/0723 455/434
2013/0321130 A1 * 12/2013 Waffaoui ........... G06K 19/0726 235/492
2019/0074915 A1 * 3/2019 Greene ................. G01S 13/751

* cited by examiner

*Primary Examiner* — Rexford N Barnie
*Assistant Examiner* — Swarna N Chowdhuri
(74) *Attorney, Agent, or Firm* — Li & Cai Intellectual Property (USA) Office

(57) ABSTRACT

A power extraction circuit for Radio Frequency Identification (RFID) tags and power extraction method thereof is a circuit and method for maximizing the efficiency of power harvesting in RFID tags. The power extraction circuit comprises an impedance matching network, a rectifier, and a tuning circuit. The tuning circuit comprises a power-on-reset (POR) circuit, a voltage regulator, two voltage-controlled switches, two voltage-to-time converters, a clock generator, a counter, and a control circuit.

9 Claims, 4 Drawing Sheets

POWER EXTRACTION CIRCUIT FOR RADIO FREQUENCY IDENTIFICATION (RFID) TAGS AND POWER EXTRACTION METHOD THEREOF

FIELD OF THE DISCLOSURE

The present invention relates to the field of radio frequency identification (RFID) technology, and more particularly, to a power extraction circuit for Radio Frequency Identification (RFID) and power extraction method thereof

BACKGROUND OF THE DISCLOSURE

Radio-frequency identification (RFID) systems typically comprise RFID readers and RFID tags. RFID readers are also known as RFID interrogators or RFID writers. RFID tags typically comprise an antenna and an integrated circuit (IC) coupled together and formed on a substrate. Some RFID tags, which operate on power from an energy-storage device such as a battery, are known as active or battery-assisted RFID tags. Some RFID tags, which do not have an energy-storage device such as a battery, are called passive RFID tags. The passive RFID tags operate on energy extracted from the electromagnetic RF wave transmitted from the RFID readers. The operating distance of an RFID system is determined by the transmitted power of the RFID reader and the power extraction efficiency of the RFID tag. The maximally allowable transmitted power of the RFID reader is governed by regulations. Thus, the efficiency of RF power extraction of the RFID tags must be optimized to achieve a maximum operating distance.

The power transfer from the antenna to the IC of the RFID tags can be maximized by matching the input impedance of the IC to the impedance of the antenna. The impedance matching may be achieved by using an impedance matching network to couple between the antenna and the IC. The impedance matching network should ensure that the antenna impedance is equal to the complex conjugate of the IC input impedance. The impedance matching network may be realized by discrete components such as capacitors or inductors or may be realized by a part of the antenna. There are several factors that can affect the antenna impedance and the IC impedance. The antenna impedance may be varied by environmental conditions such as humidity, substrate material, etc. The IC impedance may be varied by the IC fabrication process variation. An impedance matching network that works well for one IC under one condition will not work as well for another IC under a different condition. As the quality of impedance matching degrades, the sensitivity of an RFID tag degrades, and the operating distance of the RFID system is decreased. Therefore, a method for tuning the IC input impedance is needed to vary the IC impedance to match the antenna impedance for different ICs and conditions.

The U.S. Pat. Nos. 7,167,090 B1 and 8,045,947 B2 described a far-field RF power extraction system that is capable of extracting power from a reader's transmitted RF signal over a distance. The system includes an RF antenna for capturing the transmitted RF signal, a rectifying circuit for converting the AC signal to a DC signal, an impedance matching network, a charge-pump circuit, a variable tuning capacitance, and a feedback tuning circuit. The feedback tuning circuit comprises a bias generator circuit, a clock generator, a slope detector, a predictor, and an integrator. The feedback tuning circuit uses a derivative-based controller which calculates the slope of the output voltage of the rectifier (Venv) and tries to achieve a maximum Venv. The controller gives an output voltage which is used to control the capacitance of the tunable capacitor, thus controlling the resonant frequency of the antenna. The slope detector employs a sample-and-hold circuit and a comparator to make a comparison between the current and the previous values of Venv. A limitation of these prior arts is the performance degradation of the tuning mechanism due to the effects of IC process variations on the analog circuits such as current sources (in the integrator) and comparator. Another limitation is the sensitivity of the tuning method to amplitude-modulated noise and variation in RF transmitted power.

The U.S. Pat. No. 7,586,385 B2 described a method and apparatus for varying the impedance of an LC resonant tank. In RFID communication, mismatch between the carrier frequency (fc) of the transmitter and the resonant frequency (fr) of the receiving antenna results in loss of transmitted power. This patent disclosed a method and apparatus to vary the impedance of the receiving antenna LC resonant circuit to tune $f_r$ to match $f_c$. The disclosed method and apparatus operate as follows. A rectifier and a lowpass filter are used to generate a DC voltage (Vref) which is proportional to the antenna voltage. A sample-and-hold circuit and a comparator are used to calculate the slope of Vref by making a comparison between the current and the previous values of Vref. When the current value of Vref is larger than the previous value, the output voltage of the comparator is high, and vice versa. The output of the comparator is used to control the direction of varying impedance. When the system is powered up, the direction of varying impedance is selected to be either up or down. When the comparator output is high, the direction of varying impedance is maintained. When the comparator output is low, the direction of varying impedance is changed. A limitation of this prior art is the performance degradation of the tuning mechanism due to the effects of IC process variations on the analog circuits such as the comparator.

The U.S. Pat. No. 8,730,016 B2 disclosed a non-contact communication device (i.e., RFID) and a method for tuning the device. The device comprises an antenna, a power extraction circuit, a communication unit, a tuning circuit, and a matching network. The tuning circuit employs a phase detector to detect a phase difference between the voltage and the current of a part of the antenna. Depending on the phase difference, the tuning circuit is configured to adjust the impedance of the matching network to optimize the power extraction efficiency. The matching network comprises a capacitor bank that provides a selectable capacitance. The tuning circuit is configured to select the capacitance of the matching network to minimize the quadrature phase error. The power extraction circuit comprises two subunits: one for extracting power to the tuning circuit and another for extracting power to the communication unit. The tuning circuit can operate under conditions which there is not enough extracted power to operate the communication unit. The method of operating the device comprises: receiving an RF signal at the antenna; extracting power from the RF signal using the power extraction circuit; using a part of the extracted power for the tuning circuit; detecting a phase difference between the voltage and current of the RF signal; creating a quadrature phase error signal and responding to the quadrature phase error signal by adjusting the capacitance of the impedance matching network to minimize the quadrature phase error. There are some limitations of this patent. Firstly, it requires two power extraction circuits which results in increasing the die area and cost of the IC.

Secondly, it requires 3 contact terminals to the IC which may cause complication and increasing of the cost in tag manufacturing.

The U.S. Pat. No. 8,952,792 B1 described a tuning circuit in an RFID tag that may be used to match antenna and integrated circuit (IC) impedances to maximize the efficiency of IC power extraction from an incident RF wave. The tuning circuit, which requires less power to operate than the IC, adjusts a variable impedance to improve the impedance matching between the IC and the tag antenna and thereby increase the IC power extraction efficiency. The IC may begin operating according to a protocol when it extracts sufficient power from the RF wave or when an optimal impedance matching, and power transfer is achieved. A limitation of this prior art is that the performance of the tuning circuit may be degraded by the noise and offset of the comparator and the inaccuracy and variation of the comparator's reference voltage.

The US 2006/0094425 A1 disclosed an RF energy harvesting circuit comprising an automatic tuning mechanism configured to scan across a range of frequencies and select ambient RF signals with sufficient strength to generate usable power. The system includes a broadband antenna, a tuning circuit, a rectifier, and control circuit to optimize energy harvesting for charging a power storage device. However, this approach is not well suited for RFID power extraction circuits because the harvested power strongly depends on unpredictable ambient RF sources, resulting in unstable and low energy output. Moreover, the tuning process consumes additional energy, thereby reducing the net extracted power available to the RFID circuit. The need for continuous frequency searching also increases system complexity and may lead to inefficient operation.

The US 2013/0321130 A1 discloses an RFID tag having a tunable impedance circuit, such as a capacitor bank controlled by a state-machine logic, to adjust the input impedance of the tag for improved RF power reception and detuning compensation. The system aims to enhance the power delivered to the RF-to-DC converter in the tag. Nevertheless, this solution exhibits limitations in power extraction efficiency. The tuning mechanism depends on sufficient initial RF energy, thereby causing startup difficulties in low-field conditions typical of passive RFID systems. In addition, the use of complex capacitor banks and switching elements increases circuit complexity and losses, which may reduce the efficiency of the extracted power. Furthermore, compensation may be insufficient under rapidly changing environmental conditions.

The U.S. Pat. No. 9,646,186 B1 describes a self-tuning RFID tag that adjusts impedance matching and/or rectifier bias to increase the amount of RF power exacted from an incident signal. The tuning process may rely on stored parameters and iterative optimization to maximize power extraction. However, this approach still suffers from limitations in practical RFID power extraction. The tuning process requires sufficient harvested energy to operate, which may not be available during initial tag activation. Additionally, iterative or stored tuning schemes may not rapidly adapt to dynamic changes in impedance, thereby limiting real-time power extraction efficiency. The implementation complexity and control overhead may also introduce additional power consumption.

The US 2019/0074915 A1 discloses a wireless RF power transmission system including communication between a transmitter and a receiver to control power delivery, wherein RF signals are used to both transmit energy and exchange identification information. However, this system is not optimized for RFID power extraction circuits, as it relies on active communication and controlled transmission rather than passive energy harvesting. The requirement for bidirectional signaling increases power consumption and system complexity. In addition, the efficiency of RF power transfer is highly dependent on distance and alignment, resulting in reduced power availability for the receiving circuit, which is not suitable for low-power passive RFID applications.

To overcome these challenges, there is a need to develop systems or methods to increase the efficiency of power harvesting of the RFID tags especially the power extraction circuit. The circuit and method of power extraction should be less sensitive to non-idealities of analog circuits and IC process variations, and allowing the RFID ICs and tags to be implemented with small die area and low cost.

SUMMARY OF THE DISCLOSURE

The present invention described herein generally relates to a power extraction circuit for Radio Frequency Identification (RFID) tags and power extraction method thereof. The power extraction circuit comprises an impedance matching network, a rectifier, and a tuning circuit. The tuning circuit comprises a power-on-reset (POR) circuit, a voltage regulator, two voltage-controlled switches, two voltage-to-time converters, a clock generator, a counter, and a control circuit.

The general purpose of the present invention is to increase the efficiency of power harvesting in the power extraction circuit of the RFID tag. The power extraction circuit for RFID tags and power extraction method thereof requires fewer components and area, less circuit complexity, and low cost of implementation.

DETAILED DESCRIPTION OF THE EXEMPLARY EMBODIMENTS

An RFID system typically comprises an RFID tag and an RFID reader. The RFID reader transmits RF signals to deliver power and communication commands to the RFID tags. Upon receiving sufficient power, the RFID tags respond to the commands from the RFID readers and then transmit the requested data to the RFID reader by reflecting the RF signals.

Figure 1:
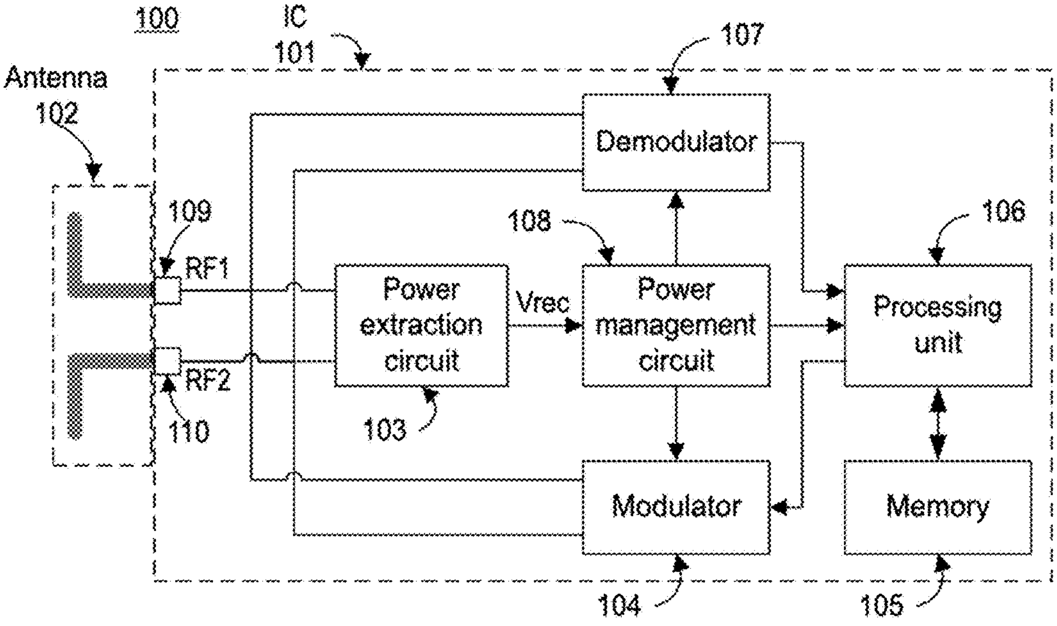
FIG. 1. is a block diagram of an RFID tag.

FIG. 1. shows a simplified block diagram of the RFID tags. The RFID tags 100 comprises a RFID IC 101, an antenna 102. The RFID IC 101 comprises two IC contacts 109 and 110, a power extraction circuit 103, a power management circuit 108, a demodulator 107, a modulator 104, a processing unit 106 and a memory 105.

The antenna 102 is coupled to the two IC contacts 109 and 110. The antenna 102 is configured to receive an RF signal, which are wirelessly transmitted from an RFID reader and provide the received RF signal to the two IC contacts 109 and 110. The antenna 102 typically comprises two antenna segments, which are coupled to the two IC contacts 109 and 110. The IC contacts 109 and 110 may be constructed from metallic pads or any other suitable way. The two IC contacts 109 and 110 are connected to the power extraction circuit 103, the demodulator 107, and the modulator 104. The power extraction circuit 103 converts the received RF signal from the antenna 102 to a DC voltage (Vrec), which is applied to the power management unit 108. The power management unit regulates the received DC voltage (Vrec) to provide power supply voltages to the demodulator 107, the modulator 104, the processing unit 106 and the memory 105 of the RFID IC 101. The demodulator 107 demodulates the received RF signal and provide a demodulated output signal to the processing unit 106. The processing unit 106 may perform operations on the demodulated signal received from the demodulator. In some operations, the processing unit 106 may retrieve or store data in the memory unit 105. The memory unit 105 is preferably implemented by a nonvolatile memory, which can retain data when the RFID tag 100 does not have power. The processing unit 106 may generate an output signal for data transmission to the modulator 104. The modulator 104 modulates the output signal generated by the processing unit 106 and generates a modulated output signal. The modulator 104 drives the antenna terminals via the two IC contacts 109 and 110 to transmit the modulated signal.

Figure 2:
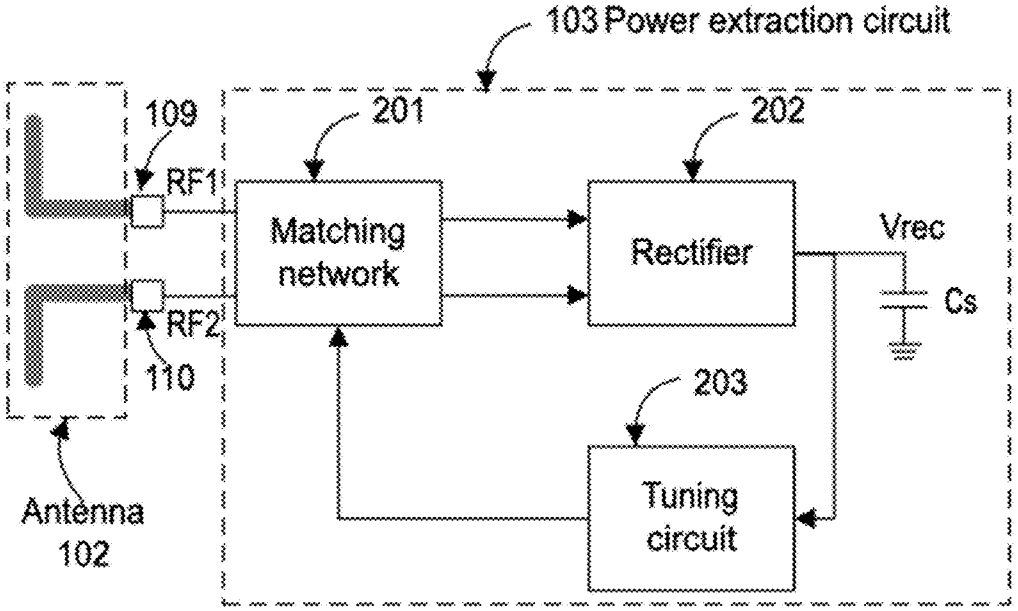
FIG. 2. is a block diagram of the power extraction circuit.

FIG. 2. shows a simplified block diagram of the power extraction circuit. The power extraction circuit 103 comprises an impedance matching network 201, a rectifier 202, and a tuning circuit 203. The impedance matching network 201 is typically a network of passive components, and has two input terminals and two output terminals, matches the antenna impedance to the IC impedance. The input terminals of the matching network 201 are connected to the two IC contacts 109 and 110 to receive the RF signals from the antenna. The output terminals of the matching network 201 are connected to the input terminals of the rectifier 202. The matching network 201 will match impedance of the antenna 102 with the impedance of the RFID IC 101. The rectifier 202 receives the RF signals from the matching network 201 and converts them to a DC output voltage (Vrec). The rectifier output may be connected to a capacitor (Cs), which acts as an energy storage. In a typical RFID communication, the RFID IC 101 utilizes the power available from the rectifier output for its operation. In an RFID tag, especially a passive RFID tag, it is strongly desirable to optimize the efficiency of the power extraction circuit to provide as much power as possible for the RFID IC operation. The efficiency of the power extraction depends on the impedance matching between the antenna impedance and the input impedance of the rectifier. The extracted power is maximized when the antenna impedance is the complex conjugate of the impedance of the rectifier. The impedance matching network 201 ensures that the impedance matching between the antenna impedance and the IC impedance is achieved. The impedance matching network 201 is typically realized by discrete components such as capacitors or inductors or may be realized by a part of the antenna. However, there are several factors that can affect the antenna impedance and the IC impedance such as humidity, substrate material and IC process variation. Typically, the impedance matching network 201 can only achieve the optimum impedance matching under one condition. The tuning circuit 203 is included in a feedback loop to adjust a variable impedance in the impedance matching network to maximize the rectifier output voltage (Vrec) under different conditions.

Figure 3:
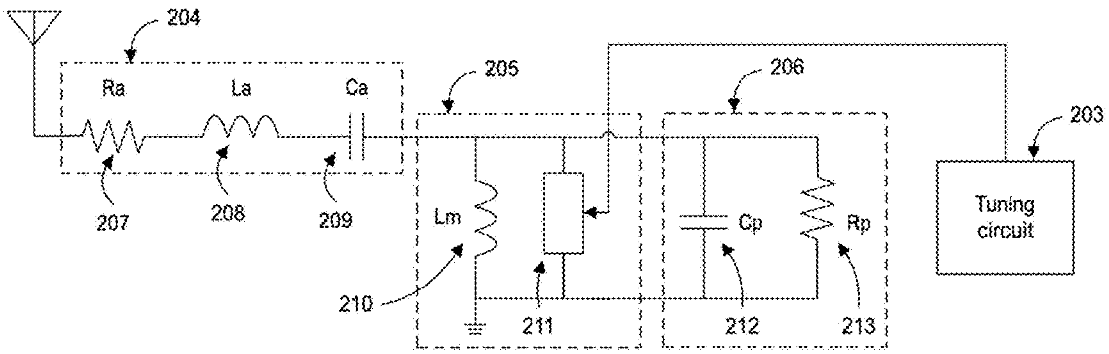
FIG. 3. is a diagram of an equivalent circuit of an RFID tag front-end including the tuning circuit.

FIG. 3. shows a diagram of an equivalent circuit of an RFID tag front-end including the tuning circuit. This equivalent circuit will be familiar to a person skilled in the art and model various impedances of an RFID tag. The equivalent circuit comprises a circuit model 204 of the antenna, a circuit model 206 of the input impedance of the IC, and a circuit model 210 of the impedance matching network. The circuit model 204 of the antenna includes an inductor La 208, a resistor Ra 207, and a capacitor Ca 209. The inductor La 208 and the capacitor Ca 209 model the reactive part of the antenna impedance. The resistor Ra 207 models the real part of the antenna impedance. The circuit model 206 of the input impedance of the IC includes a resistor Rp 213 and a capacitor Cp 212. The resistor Rp 213 models the real part of the IC impedance and the capacitor Cp 212 models the reactance part of the IC impedance. The circuit model of the impedance matching network includes an inductor Lm 210 and a variable impedance 211, which is coupled to the tuning circuit. To obtain the maximum power transfer between the antenna and the IC, the antenna impedance should be the complex conjugate of the IC impedance. The tuning circuit is used to adjust the variable impedance to obtain the desired complex conjugate matching when the antenna and IC impedances may have some alterations due to variations in IC processes and RFID tag operating conditions.

Figure 4:
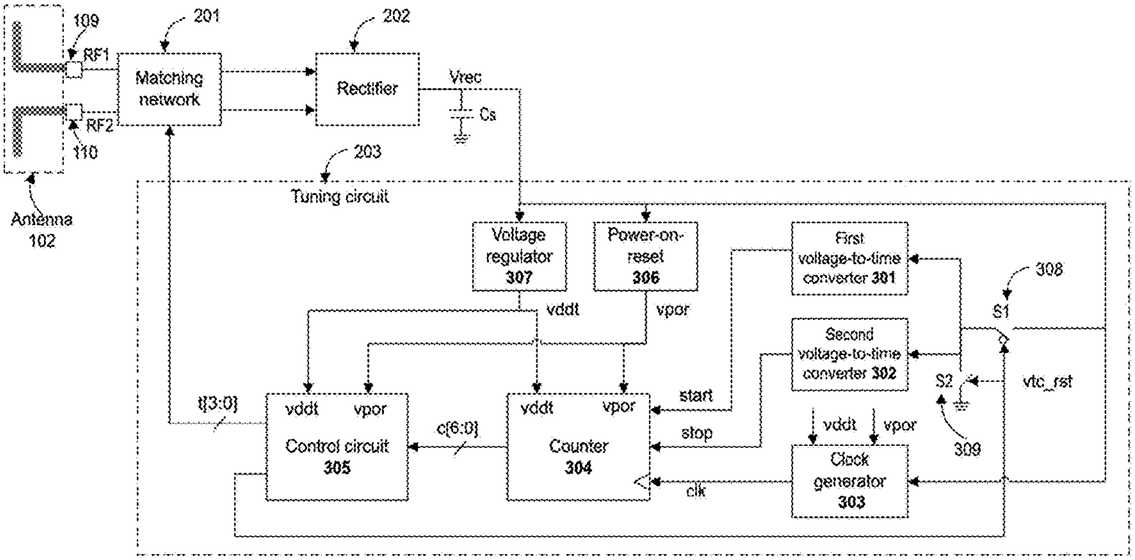
FIG. 4. is a block diagram showing how the tuning circuit may be implemented.

FIG. 4 shows a block diagram showing how the tuning circuit may be implemented. The tuning circuit 203 comprises a power-on-reset (POR) circuit 306, a voltage regulator 307, two voltage-controlled switches S1 and S2 308 and 309, a first voltage-to-time converter 301, a second voltage-to-time converter 302, a clock generator 303, a counter 304, and a control circuit 305. The matching network 201 receive the RF signal from the antenna 102 through the two IC contacts 109 and 110 and matches the impedance of the antenna 102 with the impedance of the RFID IC 101. Then the matching network will transmit the RF signals to the rectifier 202 and converts them to the DC output voltage (Vrec). The rectifier output is connected to a capacitor (Cs), which acts as an energy storage. The tuning circuit 203 operates by drawing power from the output of the rectifier 202. The voltage regulator 307 regulates the output voltage of the rectifier (Vrec) to provide a more stable power supply voltage (vddt) to the counter 304, the clock generator 303 and the control circuit 305. The POR circuit 306 generates a power-on-reset signal (vpor) to reset all subcircuits of the tuning circuit 203 to an initial state in step 402 when a sufficient RF power level is received at the antenna 102 such that the rectifier output voltage Vrec exceeds a threshold voltage level (Vth_por) in step 401.

The controllable switches S1 and S2 308 and 309 may be realized by metal-oxide-semiconductor field-effect transistors (MOSFETs) or any other suitable ways. The first and the second voltage-to-time converters 301 and 302 generate two output voltage pulse signals which have different time responses to the magnitude of the rectifier output voltage. The circuit implementations of the first and the second voltage-to-time converters 301 and 302 may be topologically the same. The first voltage-to-time converter 301 is configured to have a faster output response time to the rectifier output voltage (Vrec) and generates a first pulse output voltage signal (start). When the first pulse voltage signal 'start' changes from a low voltage level to a high voltage level, the counter 304 starts counting. The second voltage-to-time converter 302 is configured to have a slower output response time to the rectifier output voltage (Vrec) and generates a second pulse output voltage signal (stop). When the second pulse voltage signal 'stop' changes from a low voltage level to a high voltage level, the counter stops counting. The clock generator 303 generates a square wave clock signal (clk) for the counter 304. The clock generator 303 may be implemented by a ring oscillator or any other suitable ways. The counter 304 counts the number of clock cycles during the start and the stop period and produces a digital output signal. FIG. 4 is also showing an exemplary implementation of the counter 304 which has a 7-bit digital output (c[6:0]) and can count the number of clock cycles from 0 to 127. The control circuit 305 receives the digital output (c[6:0]) from the counter 304 and generates a digital tuning word (t[3:0]) that adjusts the variable impedance within the matching network. In additional, the FIG. 3 also shows an exemplary implementation of the control circuit 305, which generates a 4-bit digital tuning word (t[3:0]) for the adjustment of the variable impedance. The control circuit 305 also produces a voltage pulse signal (vtc_rst) to reset the input voltages of the first and the second voltage-to-time converters to zero volt before the counter 304 starts counting.

Figure 5:
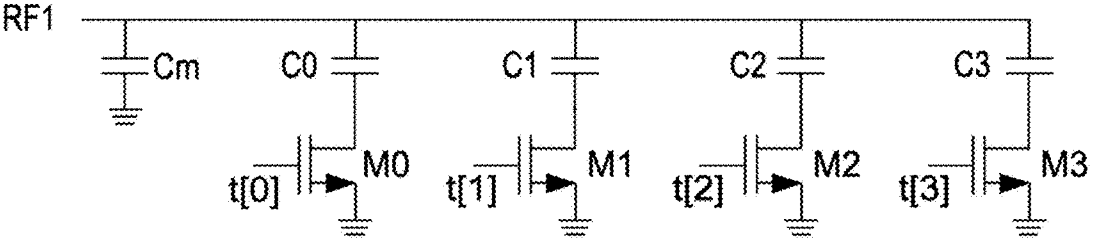
FIG. 5. is a circuit diagram of a switched capacitor bank for tuning the impedance matching network.

FIG. 5 shows a circuit diagram of an example switched capacitor bank for tuning the impedance matching network. This circuit will be familiar to a person skilled in the art and comprises a set of capacitors and switches to provide a programmable capacitance. The embodiment, shown in FIG. 5, comprises a fixed capacitor Cm and four selectable capacitors (C0, C1, C2, C3). The capacitor Cm is permanently connected to the antenna port RF1 109. The capacitors C0, C1, C2, and C3 may be selectively connected to the antenna port RF1 109. The selectable capacitors are selected by means of the switches M0, M1, M2, M3, which are controlled by the digital tuning bits t[0]-t[3]. The switches may be implemented by MOSFETs or any other suitable ways. The selectable capacitors (C0, C1, C2, C3) may have capacitance which increases in a binary fashion (i.e., C0=Cu, C1=2Cu, C2=4Cu, C3=8Cu). Therefore, the embodiment shown in FIG. 5 can provide a tunable capacitance range from Cm up to (Cm+15Cu) with a step size of Cu. An identical switched capacitor bank may also be used to provide a tunable capacitance at the other antenna port RF2 110.

Figure 6:
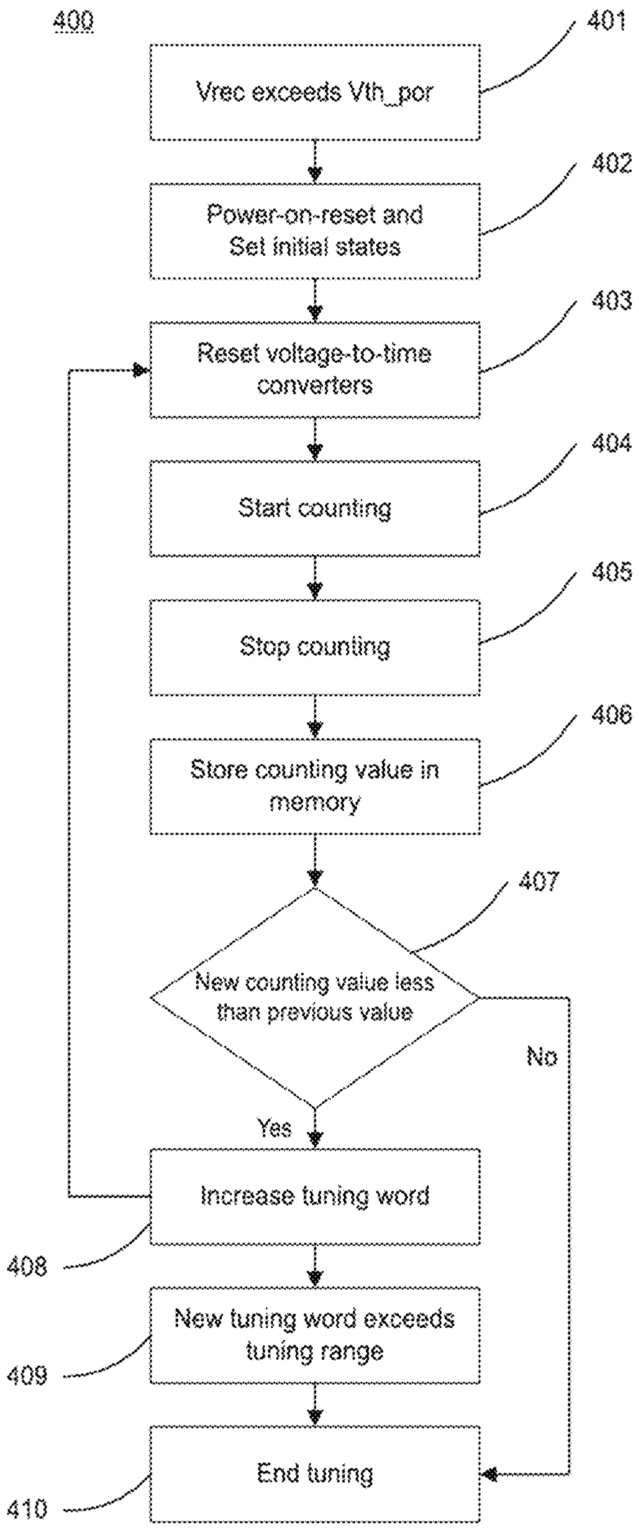
FIG. 6. is a flow diagram of the method of tuning impedance.

FIG. 6 shows a flow diagram of the method of tuning impedance. In step 401, when a sufficient RF power level is received at the antenna 102 such that the rectifier output voltage Vrec exceeds a threshold voltage level (Vth_por), the POR circuit 306 will generate a power-on-reset signal (vpor) to reset all subcircuits of the tuning circuit 203 to an initial state in step 402. In step 402, the digital tuning word t[3:0] may be set to an initial value that sets the variable impedance to an initial value. In the initial setting, the impedance matching for the power extraction circuit may not be optimal and Vrec may not be maximized. In the impedance tuning process, the tuning circuit 203 will adjust the variable impedance in the impedance matching network 201 to maximize Vrec. After the POR reset, the voltage regulator 307 generates a stable power supply voltage (vddt) to the subcircuits of the tuning circuit. The clock generator 303 begins generating the clock signal, clk, for the counter 304, and the control circuit 305 generates a voltage pulse signal, vtc_rst, to reset the first and second voltage-to-time converters 301 and 302, as shown in step 403. The pulse signal vtc_rst goes from a low voltage level to a high voltage level for a short period of time and returns to a low voltage level. The low voltage level may have a value of 0 V and the high voltage level may have a value of vddt. When vtc_rst is vddt, the switch S1 308 is turned off and the switch S2 309 is turned on. This disconnects Vrec from the inputs of both voltage-to-time converters and resets the input and output voltages of both voltage-to-time converters to 0 V.

When vtc_rst returns 0 V, the switch S1 308 is turned on and the switch S2 309 is turned off. This connects Vrec to the inputs of both voltage-to-time converters 301 and 302 and the output voltages of both voltage-to-time converters 301 and 302 gradually increase to the high voltage level. The first and second voltage-to-time converters 301 and 302 are configured to have different rates of output voltage response to Vrec. The first voltage-to-time converter 301 is configured to have a faster output response time to Vrec and its output increases to the high voltage level faster than the second voltage-to-time converter 302. When the output of the first voltage-to-time converter 301 (start) changes from the low voltage level to the high voltage level, the counter 304 starts counting, as shown in step 404. The second voltage-to-time converter 302 is configured to have a slower output response time to Vrec and its output increases to the high voltage level slower than the first voltage-to-time converter 301. When the output of the second voltage-to-time converter 302 (stop) changes from the low voltage level to the high voltage level, the counter 304 stops counting, as shown in step 405. When the counting is stopped, the digital output (c[6:0]) of the counter 304 represents the number of clock cycles counted during the counting period. In FIG. 4, the exemplary counter has a 7-bit digital output (c[6:0]) and can count the number of clock cycles from 0 to 127. The digital signal c[6:0] of the counting period is stored in a memory element embedded in the control circuit, as shown in step 406. The memory element may be implemented by a shift register or any other suitable ways.

After storing the counter values in the memory as in step 406, the control circuit 305 makes a comparison, as shown in step 407, between the new counter value and the previous counter value. If the new counter value is not less than the previous counter value, the tuning process is ended, as shown in step 410 and the previous digital tuning word (t[3:0]) is used to adjust the variable impedance. If the new counter value is less than the previous counter value, the control circuit 305 increases the digital tuning word t[3:0] by one, as shown in step 408 and generates the pulse signal vtc_rst to reset the inputs and outputs of both voltage-to-time converters 301 and 302, and the tuning process continues. The tuning process continues if the new counter value is less than the previous counting value. The tuning process is ended in step 410 if the new counting value is not less than the previous counting value or the new impedance tuning word exceeds the tuning range in step 409.

Figure 7:
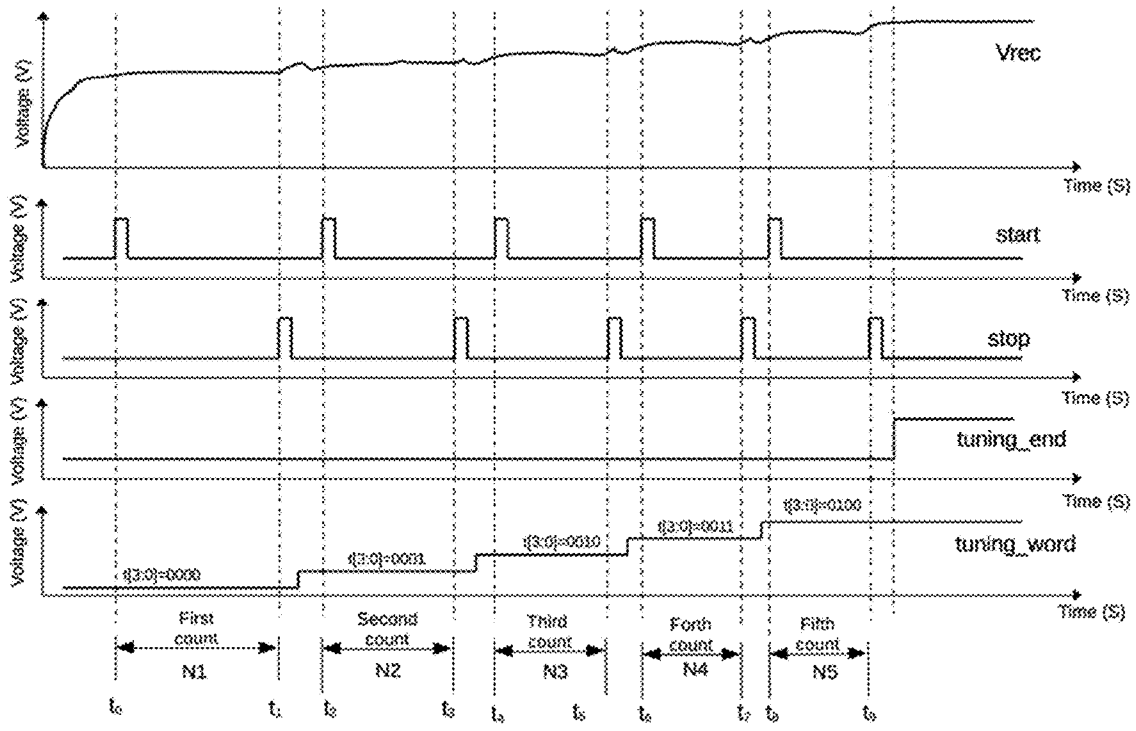
FIG. 7. is a simulation result of the impedance tuning process by the tuning circuit in accordance with embodiments of the invention.

FIG. 7 shows a simulation result of the impedance tuning process by the tuning circuit in accordance with embodiments of the invention. The figure shows several voltages (in V) plotted again time (in S). When the rectifier output voltage Vrec exceeds the threshold voltage level 401 of the power-on-reset circuit, the circuit is reset to the initial state and the tuning word t[3:0] is set to 0000 and the counter starts 404 the first counting at time to. The counter stops 405 the first counting at time $t_1$ and the counter output values is N1. The control circuit increases the tuning word by one 408 (i.e., t[3:0]=0001) and both voltage-to-time converters and the counter are reset 403, and the counter starts 404 the second counting at time $t_2$ and stops 405 at time $t_3$. The counter output value for the second counting is N2. The control circuit makes a comparison 407 between N1 and N2.

In FIG. 7, N2 is less than N1 thus the control circuit increases the tuning word by one 408 (i.e., t[3:0]=0010). Both voltage-to-time converters and the counter are reset 403 again and the counter begin the third counting at time $t_4$. The process repeats itself in a loop until the new counter value is not less than the previous counter value. In FIG. 7, the counter output value N5 of the fifth counting period is not less than the counter output value N4 of the forth counting period, thus the tuning process is ended after the fifth counting period and the tuning word t[3:0]=0100 is used to obtain the optimum impedance setting to maximize the rectifier output voltage (Vrec).

What is claimed is:

1. A power extraction circuit for a Radio Frequency Identification (RFID) tag, comprising:

a rectifier for converting an alternating current (AC) RF voltage received by an antenna coupled to the RFID tag to a direct current (DC) voltage at an output of the rectifier;

an impedance matching network including a variable impedance for matching the antenna's impedance to the rectifier's input impedance, wherein the variable impedance includes at least a switched capacitor bank coupled to the antenna; and a tuning circuit for tuning the variable impedance, wherein the tuning circuit having an input terminal coupled to the output of the rectifier and an output terminal coupled to the variable impedance, wherein the tuning circuit, comprising:

a first voltage-to-time converter for converting the DC output voltage of the rectifier into a first timing signal;

a second voltage-to-time converter for converting the DC output voltage of the rectifier into a second timing signal;

a clock generator for generating a clock signal for operation of the tuning circuit;

a power-on-reset circuit for resetting the tuning circuit to an initial state;

a voltage regulator for providing a stable supply voltage to the tuning circuit;

a digital counter for counting number of cycles of the clock signal during a time period determined by the first timing signal and the second timing signal; and a digital control circuit for providing a digital tuning word to the variable impedance based on a comparison of two successive counter output values of the digital counter.

2. The power extraction circuit of claim 1, wherein the tuning circuit begins an impedance tuning process when the DC output voltage of the rectifier exceeds a threshold voltage level configured by the power-on-reset circuit.

3. The power extraction circuit of claim 1, wherein the variable impedance and the tuning circuit are set to an initial state condition by a signal from the power-on-reset circuit.

4. The power extraction circuit of claim 1, wherein the first voltage-to-time converter having an input coupled to the output of the rectifier, and the first voltage-to-time converter is configured to have a fast output response time to the DC output voltage of the rectifier and provides the first timing signal to start the digital counter.

5. The power extraction circuit of claim 1, wherein the second voltage-to-time converter having an input coupled to the output of the rectifier, and the second voltage-to-time converter is configured to have a slow output response time to the DC output voltage of the rectifier and provides the second timing signal to stop the digital counter.

6. The power extraction circuit of claim 1, wherein the time period is a duration between the first timing signal and the second timing signal.

7. The power extraction circuit of claim 1, wherein the digital control circuit providing the digital tuning word to the variable impedance based on performs the comparison of two successive counter output values of the digital counter, further comprising:

when a current counter output value is less than a previous counter output values, the digital tuning word is increased;

when a current counter output value is equal to a previous counter output value, the digital tuning word is maintained; and when a current counter output value is more than a previous counter output value, the digital tuning word is maintained.

8. A method for operating a power extraction circuit for a Radio Frequency Identification (RFID) tag, comprising:

converting an alternating current (AC) RF voltage received by an antenna coupled to the RFID tag to a direct current (DC) voltage using a rectifier;

tuning a variable impedance coupled to the antenna by a tuning circuit;

resetting the tuning circuit to an initial state using a power-on-reset circuit, when the DC voltage of the rectifier exceeds a threshold voltage level of the power-on-reset circuit;

generating a first timing signal in response to the DC voltage of the rectifier using a first voltage-to-time converter;

generating a second timing signal in response to the DC voltage of the rectifier using a second voltage-to-time converter;

performing a first counting operation using a counter and generating a first counter output value, wherein the first counting operation is started by the first timing signal and the first counting operation is stopped by the second timing signal;

performing a second counting operation using the counter and generating a second counter output value, wherein the second counting operation is started by the first timing signal and the second counting operation is stopped by the second timing signal;

comparing the first and the second counter output values of two successive counting operations and generating a comparison output signal; and generating a digital tuning word to tune the variable impedance in dependence of the comparison output signal.

9. The method of claim 7, wherein the generating the digital tuning word to tune the variable impedance in dependence of the comparison output signal, comprising:

when the second counter output value is less than the first counter output value, the digital tuning word is increased;

when the second counter output value is more than the first counter output value, the digital tuning word is maintained; and when the second counter output value is equal to the first counter output value, the digital tuning word is maintained.

* * * * *